United States Patent
Zhou et al.

(10) Patent No.: US 9,372,241 B2
(45) Date of Patent: Jun. 21, 2016

(54) MULTI-DIRECTIONAL PIN ANNEAL OF MR SENSORS WITH PLASMON HEATING

(75) Inventors: Yuchen Zhou, San Jose, CA (US); Xuhui Jin, San Jose, CA (US); Grace Gorman, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 956 days.

(21) Appl. No.: 12/590,364

(22) Filed: Nov. 6, 2009

(65) Prior Publication Data

US 2011/0111133 A1    May 12, 2011

(51) Int. Cl.

| | |
|---|---|
| *B05D 3/06* | (2006.01) |
| *G01R 33/09* | (2006.01) |
| *B82Y 25/00* | (2011.01) |
| *B82Y 40/00* | (2011.01) |
| *H01F 41/30* | (2006.01) |
| *G11B 5/31* | (2006.01) |
| *G11B 5/39* | (2006.01) |
| *H01F 10/32* | (2006.01) |

(52) U.S. Cl.
CPC .............. *G01R 33/093* (2013.01); *B82Y 25/00* (2013.01); *B82Y 40/00* (2013.01); *H01F 10/3268* (2013.01); *H01F 41/304* (2013.01); *G11B 5/3163* (2013.01); *G11B 5/3903* (2013.01); *H01F 10/3254* (2013.01)

(58) Field of Classification Search
CPC ...... B82Y 40/00; C23C 4/06; C23C 14/5813; G11B 5/3163; H01F 10/3268; H01F 41/304
USPC .................................................. 427/547, 553
See application file for complete search history.

(56) References Cited

U.S. PATENT DOCUMENTS

| | | | | |
|---|---|---|---|---|
| 2,407,680 | A | * | 9/1946 | Palmquist et al. ............. 359/538 |
| 5,582,896 | A | * | 12/1996 | Kuwamoto et al. ........... 428/141 |
| 6,236,033 | B1 | * | 5/2001 | Ebbesen et al. ................ 250/216 |
| 6,727,125 | B2 | | 4/2004 | Adachi et al. |
| 6,882,146 | B2 | | 4/2005 | Maiwald |
| 7,187,835 | B1 | * | 3/2007 | Tuma et al. .................... 385/129 |
| 7,495,230 | B2 | | 2/2009 | Wei et al. |
| 2007/0058686 | A1 | * | 3/2007 | Capasso et al. ............ 372/43.01 |

* cited by examiner

*Primary Examiner* — Elena T Lightfoot
(74) *Attorney, Agent, or Firm* — Saile Ackerman LLC; Stephen B. Ackerman

(57) ABSTRACT

A method by which portions of a wafer level fabrication can be selectively heated by forming plasmon generating layers of specific size, shape, orientation and material on the fabrication and then illuminating the formation with electromagnetic radiation of such wavelength and polarization as will optimally be absorbed by the plasmon generating layers so as to generate plasmons therein. The generated plasmons thereupon produce thermal energy which is transferred to portions of the fabrication with which the plasmon generation layer has thermal contact. This method is particularly advantageous for producing multiple anneals and different magnetic pinning directions for the anti-ferromagnetic pinning layer in each of an array of GMR or TMR devices. In that process, the anti-ferromagnetic layer must be raised above its Curie temperature at which point it loses its anti-ferromagnetic properties and can have a magnetization imposed by application of an external magnetic field. The method can equally well be applied to any wafer level fabrication or deposited film fabrication in which it is desired to heat specific regions to obtain some specified result that is temperature dependent.

11 Claims, 10 Drawing Sheets

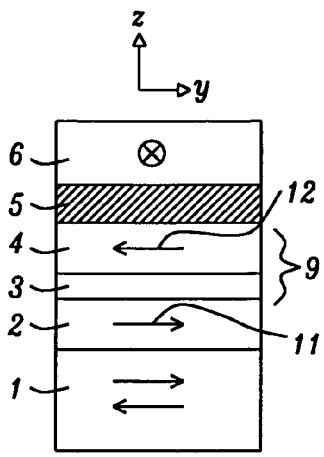
FIG. 1 – Prior Art
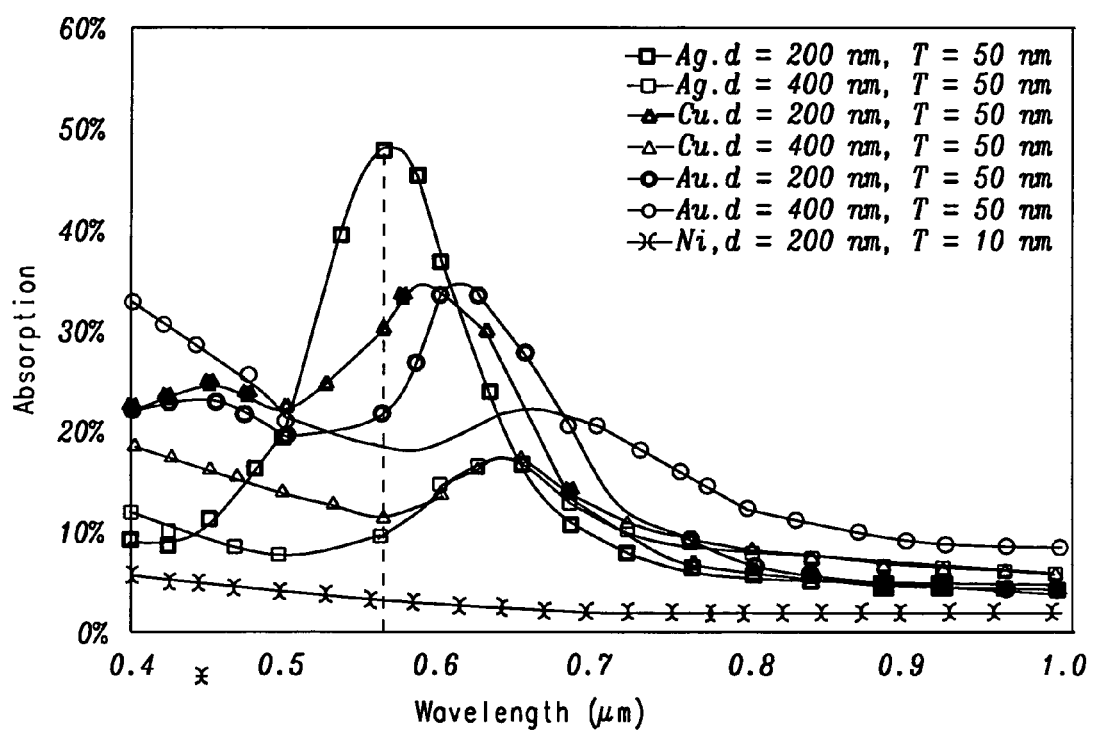
FIG. 2

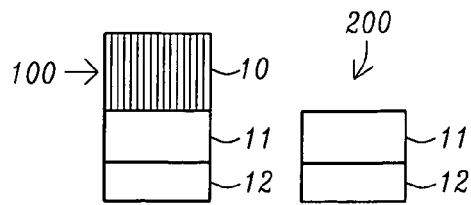
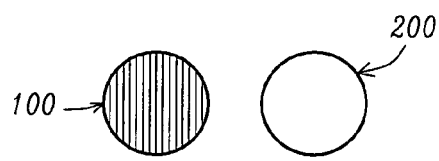
FIG. 5a    FIG. 5b
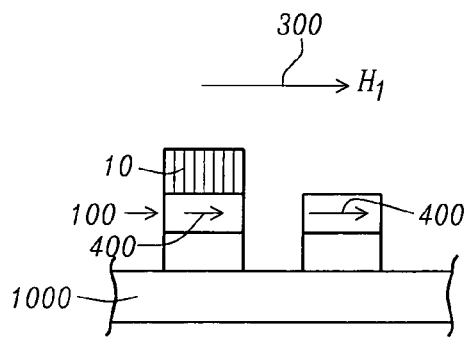
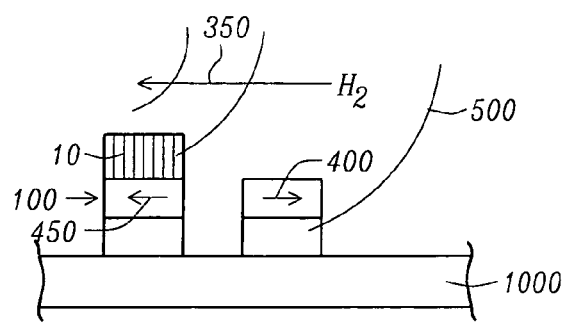
FIG. 5c    FIG. 5d
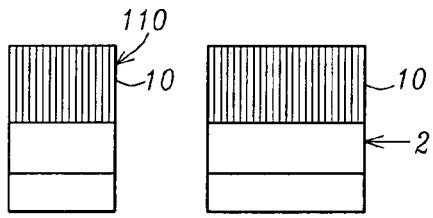
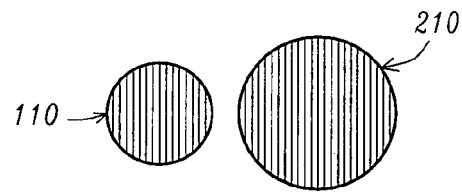
FIG. 6a    FIG. 6b
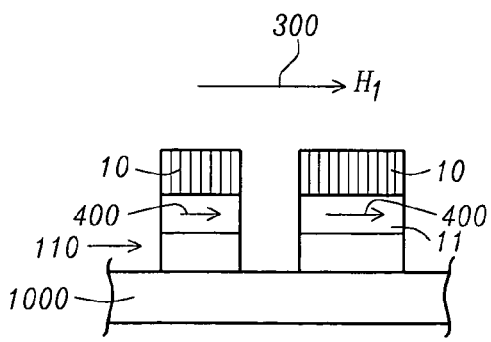
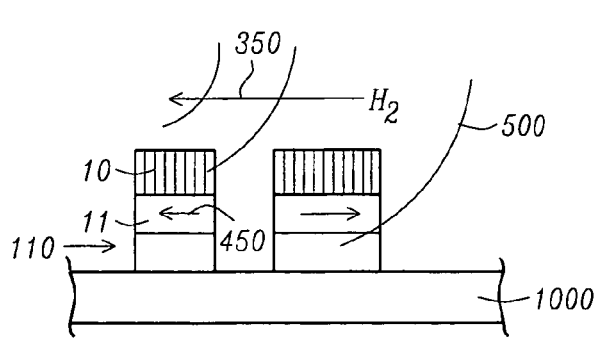
FIG. 6c    FIG. 6d

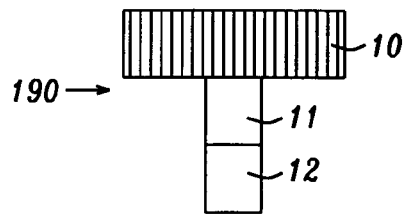
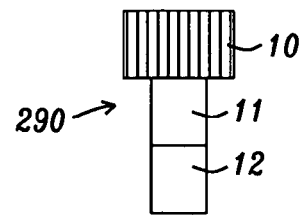
FIG. 12a
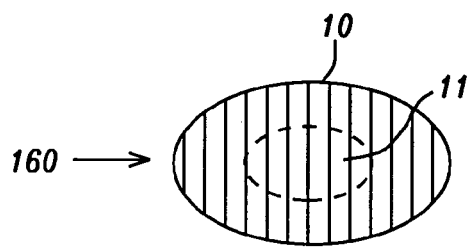
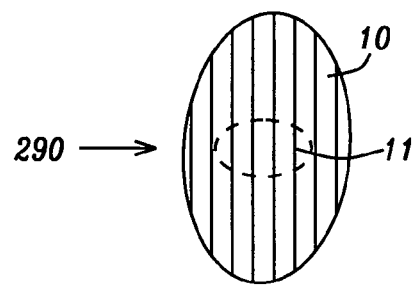
FIG. 12b
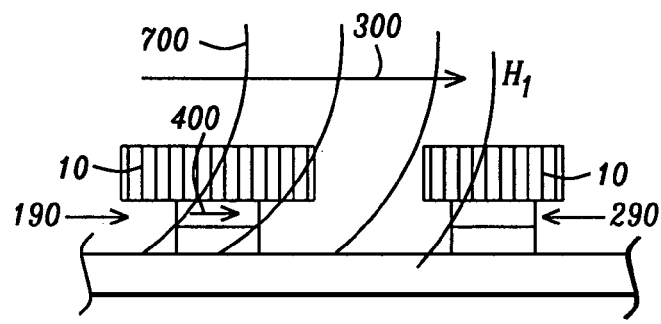
FIG. 12c
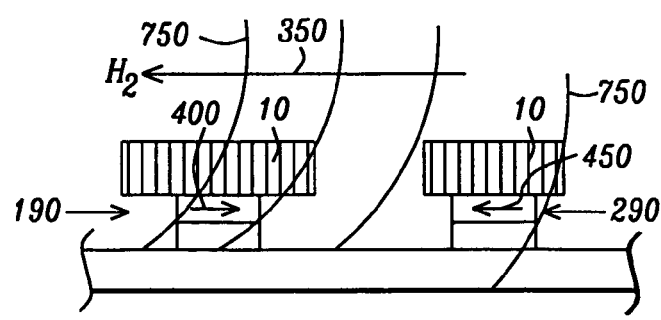
FIG. 12d

MULTI-DIRECTIONAL PIN ANNEAL OF MR SENSORS WITH PLASMON HEATING

BACKGROUND OF THE INVENTION

1. Field of the Invention

This invention relates generally to magnetic recording sensors, particularly to methods of pinning anti-ferromagnetic layers in multiple directions.

2. Description of the Related Art

The state of the art GMR (giant magneto-resistive) and TMR (tunneling magneto-resistive) magneto-resistive sensors produce a resistance change in response to an external magnetic field applied to them. The conventional film structure (configuration of magnetic and non-magnetic layers) of a GMR or TMR sensor is shown in (prior art) FIG. 1. Typically, the film structure includes an anti-ferromagnetic (AFM) layer (1), a ferromagnetic pinned layer (PL) (2), a non-magnetic Ru layer (3), a ferromagnetic reference layer (RL) (4), a non-magnetic barrier layer (5) and a ferromagnetic free layer (FL) (6). The AFM layer exchange couples to the PL layer. Due to the AFM layer's lattice structure, the PL magnetization is pinned in the +y direction as shown by arrow (11). The combined PL/Ru/RL then forms a synthetic anti-ferromagnetic (SAF) structure (9), which aligns the RL magnetization (12) in the opposite direction to the magnetization of the PL (11). Thus the combined AFM/PL/Ru/RL forms a film stack that keeps the magnetization direction (12) of the top RL layer from changing direction in the presence of an external magnetic field. The RL (4), the barrier layer (5) and the FL (6) then forms the GMR or TMR junction, where the barrier layer (5) is typically a layer of Cu (a non-magnetic conductor) for the GMR or a layer of metal oxide (a non-magnetic insulator) for the TMR. The resistance across this junction changes in accord with the relative angle of magnetization between the RL and FL magnetizations. The FL magnetization can be rotated by an external magnetic field. Since the magnetization direction of the RL is fixed, the relative angle and, therefore, the resistance, depends only on the magnetization direction of the FL.

For a GMR or TMR sensor to operate as described above, a pinning anneal process step must occur during sensor fabrication. In this process step, the sensor is heated above the blocking temperature of the AFM material so that the AFM layer changes from its AFM phase to a non-AFM phase. Meanwhile, a significantly strong external magnetic field is applied to the sensor in the direction of the desired magnetization of the PL, so that the magnetization of all magnetic layers in the sensor stack, including PL, RL and FL, are aligned in this strong field direction. Then the sensor is cooled down to room temperature for the AFM layer to return to the AFM phase through lattice reordering, while the externally applied strong magnetic field still holds. After the field is removed, the AFM layer maintains its memory of the field direction with the newly formed lattice structure and also pins the magnetization of the PL in the direction of this strong field through a surface exchange interaction. The magnetization direction of the RL (12), on the other hand, reverses direction due to the SAF effect, so it is now anti-parallel to the direction of the PL magnetization (11).

In the conventional MR (GMR or TMR) sensor fabrication process, the MR sensors on a single wafer usually have the same PL magnetization direction that results from a single step pin anneal. However, in some application areas, two or more different pin directions of magnetization are needed. In the prior art, Maiwald (U.S. Pat. No. 6,882,146 B2) discusses the magnetic angle sensor application using GMR sensors where both orthogonal and opposite pin directions are used to measure the arbitrary angle of an externally applied magnetic field. This application requires the fabrication, on a single wafer, of sensors with different pin directions.

For MR sensors having different AFM pin directions at different locations on the same wafer, the laser heating method described by Adachi et al. (U.S. Pat. No. 6,727,125) may be utilized. In this prior art, a shadow mask is used to allow laser light to illuminate and heat specific regions of a single wafer at a given time. Therefore, different regions can be annealed at different times with different magnetic field directions, which will determine the AFM pin directions at these locations. One limitation of using this method to directly heat an MR sensor element to achieve multi-directional AFM pinning, is that conventional materials used in the MR fabrication process have poor light absorption efficiency. For example, Wei et al. (U.S. Pat. No. 7,495,230) disclose a method for detecting plasmons generated by a laser that requires an integrated structure that first generates polarons that are subsequently converted to thermal electrons.

To achieve sufficient heating of the AFM material, either very high laser power or excellent focusing of the laser light will be required. It is desirable to have a high efficiency light absorbing material that can absorb the light energy and heat the AFM material effectively at a desired location, so that it either relieves one of the need for a high power light source and expensive optics or, at the same optical power, provides an increase in wafer throughput.

SUMMARY OF THE INVENTION

A first object of this invention is to provide a method of improving and varying the optical absorption efficiency of magnetic materials used in MR sensor fabrications.

A second object of the present invention is to achieve a multi-direction pin anneal on a single wafer so that different MR sensors can be fabricated with different pin directions from the same wafer.

A third object of the present invention is to achieve the first two objects using a combination of thermal heating and heating by the absorption of energy from optical frequency excited plasmons.

A fourth object of the present invention is to achieve the first three objects while also providing a method that enables the production of higher temperatures and more rapid device anneals.

A fifth object of the present invention is to provide for the previous objects while using optical sources that a process-friendly and more cost effective.

These objects of the present invention are realized by the application of surface plasmon energy to a wafer by the utilization of plasmon antenna material that couples with the MR (or other) devices fabricated on the wafer. The wafer will include an MR stack film, which is a very thin lamination of planar, horizontal magnetic and non-magnetic layers which, when patterned, will form an MR sensor (also hereinafter referred to interchangeably as a patterned sensor stack film).

A surface plasmon antenna (PA) made of Au or Ag or Cu patterned films with submicron size has already been demonstrated in heat (or thermal)-assisted-magnetic-recording (HAMR or TAMR) technology. In this technology, localized regions of a magnetic recording medium are heated above their Curie temperature, which is between approximately 500° and 600° C. This heating is achieved while the plasmon antenna is separated from the medium by an air gap of a few nanometers thickness and by other protection layers that have been applied to the medium surface.

Because of the size and shape of the patterned Ag or Au or Cu film that forms the PA element and because of its electronic properties, exposure to an alternating electric field from an incident light beam can produce motion of its conduction electrons. When the size of the patterned film is within a certain range, the conduction electrons, which are enclosed by the boundary of the film, can form an oscillatory electron current across the film plane. When their frequencies match, the electron oscillation and the light oscillation can couple and form a surface plasmon. The PA, in this plasmon mode, absorbs light energy (power) much more efficiently than a bare metal film and is able to effectively "attract" the light power in surrounding areas and concentrate it within the PA to generate the plasmon. Due to the intrinsic electrical resistance of the PA, oscillation current of the plasmon can heat the PA and the surrounding area to a high temperature in nano-seconds, as evidenced by the HAMR applications. Thus, if patterned device layer films (MR devices), or other similar devices, include appropriately positioned plasmon-supporting layers, it will be possible to transfer radiant energy to such layers and achieve highly selective heating of the devices that include such layers. Thus, to realize multiple AFM pin directions on the same wafer, patterned device layer films (MR sensors) integrated with PA films (i.e., the film material that supports a plasmon mode in a PA) can be used to achieve selective plasmon heating of the desired MR sensors by either illuminating only the selected MR sensors or by grouping the sensors with other sensors that do not absorb optical energy as efficiently.

The invention described above will include and/or provide the following:

1. A sub-micron size patterned MR sensor film used in magnetic field sensing applications that proves to have better magnetic performance than a large size continuous film.

2. A plasmon generating layer that acts as a plasmon antenna (PA) in the same sub-micron size sensor film. The generating layer demonstrates excellent light power absorption in previous applications and studies and can achieve the heating above the Curie temperature of magnetic materials that is required for an AFM pin anneal.

3. The use of a plasmon generating layer as a PA to direct plasmon energy directly on the side of an AFM layer in an MR device is a feasible process in MR manufacture.

4. A PA can effectively attract and auto-focus incident light power into the heating of an MR sensor with high efficiency and less heating of surrounding areas, thus enabling the use of lower power from the incident light source and simple optics for wafer level anneal.

5. High efficiency plasmon heating provided by a PA allows the use of low power light sources that are wafer fabrication friendly and low cost. Commercially available illumination methods, including but now limited to, incandescent, fluorescent, gas discharge, high intensity discharge, halogen, LED and low power lasers, may be used for wide area on-wafer AFM pin anneal.

6. Plasmon heating that can be made selective by coordinating the frequency and polarization of the excitation radiation with the size and shape of the antenna material coupled to the MR devices.

BRIEF DESCRIPTION OF THE DRAWINGS

FIG. 1 is a schematic representation of a prior art GMR or TMR sensor stack showing magnetization directions of various magnetic layers.

FIG. 2 is a graphical representation of a simulation of the absorption of incident light by round metallic film of thickness 50 nm and diameter of 200 nm or 400 nm.

FIG. 5a through FIG. 5d are schematic illustrations of the heat treatment of the present invention as applied to a sensor that is patterned so that sensors of same dimension are patterned side by side with one sensor having a plasmon generating layer and the other not having such a layer.

FIG. 6a through FIG. 6d are schematic illustrations of the heat treatment of the present invention as applied to sensors that are patterned so that sensors having layers of smaller horizontally circular shape and dimension are formed next to sensors having circular layers of larger dimension.

FIG. 12a through FIG. 12d are schematic illustrations of the heat treatment of the present invention as applied to elliptically patterned sensors on which elliptically patterned plasmon generating layers of larger dimension and orthogonal orientation are formed.

DESCRIPTION OF THE PREFERRED EMBODIMENTS

Figure 3:
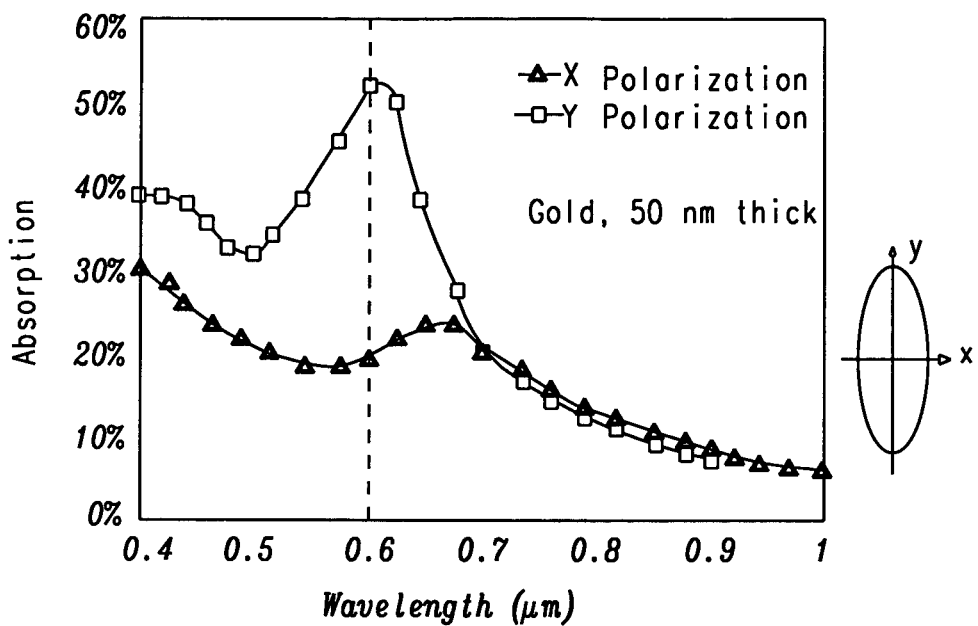
FIG. 3 is a graphical representation of a comparison of light absorption efficiency of an elliptically shaped patterned Au film when light is polarized along the x axis (short axis) or the y axis (long axis) directions. It indicates the dependence of absorption of polarization.

The preferred embodiments of the present invention include a method for selectively heating MR sensor devices, which are patterned sensor stack films formed on a wafer, or, alternatively, the method may be applied to other wafer level devices or patterned thin film depositions requiring selective heating during processing.

The patterned sensor stack films are disposed on a wafer, which disposition may be in a regular 1-dimensional array or 2-dimensional matrix, whereby different patterned portions can be heated to temperatures above their Curie temperature at which temperature they can be magnetized by an external magnetic field. In this way, a pin anneal can be applied to an AFM pinning layer within the stack film to produce different magnetization directions in the selected devices.

The method of providing the selective heating is by the utilization of a patterned layer of plasmon generating material acting as a plasmon antenna (PA) to direct energy of an optically generated plasmon onto a selected localized region of the wafer or onto regular 1-dimensional or 2-dimensional arrays of such regions. The MR devices in that region (or regions) include layers of PA material that absorb optical energy with high efficiency. Alternatively, MR devices (patterned regions) in surrounding areas are formed so that they do not absorb optical frequency energy with high efficiency. In either case, selective heating results.

Along with the method of selective heating, there are also provided methods for patterning the film stacks and the plasmon generating layers formed on the film stacks so that the heating method can be effectively implemented. To realize the desired multiple and selective AFM pin directions on the same wafer, the MR sensors, in the form of wafer level patterned sensor stack films, are integrated with PA films that are also patterned. In this way, selective plasmon heating can be obtained by illuminating either just the selected portions of the patterned sensor stack films or by illuminating a group of patterned sensor stack films that possess varying degrees of light absorption efficiency as a result of the nature of the PA film formed on them. With an external magnetic field being directed along varying directions during the plasmon heating of the selected patterned sensor stack films, together with the addition of changes in the lighting conditions of the PA, selective heating and multiple direction AFM pin annealing will be accomplished.

Referring to FIG. 2, there is shown a plot of Absorption vs. Wavelength for the absorption of light energy of a sample as a function of the wavelength of the light. The graphical illustrations clearly point out the fact that plasmon excitation and light power absorption by a patterned metallic film depends on film size and material. In the figure there are simulation results for the absorption of light by commonly used PA materials of Ag, Au and Cu. The case of a pure magnetic material of Ni is also simulated for comparison purposes.

FIG. 2 shows the clear dependence of plasmon absorption of light power on the pattern size and material. For example, 200 nm diameter Ag film has a (sharply peaked) 48% efficiency in absorbing light energy at a wavelength of 550 nm due to plasmon mode absorption, while the absorption efficiency of the same material, at a diameter of 400 nm, drops to approximately 10% at the same 550 nm wavelength.

The graph also indicates the dependence of peak absorption efficiency and peak location within the light spectrum on the various PA materials. A dramatic difference between common PA materials and Ni at 200 nm diameter (the lowest curve) can be clearly seen. The Ni shows a 3% absorption efficiency at the same wavelength at which the Ag shows a 48% efficiency. Thus, for multiple AFM pin anneal applications, MR sensors with or without PA layers, MR sensors with different size PA layers or MR sensors with different PA materials, can be used to differentiate MR sensors requiring different pin directions so they can be heated separately.

Referring next to FIG. 3, there is shown a graphical representation of simulated plasmon excitation dependence on light polarization. A patterned ellipse is shown to the right of the graph. The ellipse represents an Au sample film that is 50 nm thick and that is 200 nm maximum width (minor axis) in the x direction and 400 nm maximum width (major axis) in the y direction. The graph shows 52% absorption for light polarized along the y axis vs. 19% absorption for light polarized along the x axis, both at 600 nm wavelength. Therefore, for multiple AFM pin anneals, MR sensors patterned with large aspect ratio PA layers oriented in different in-plane directions may also be used to differentiate MR sensors with different pin directions, where different light polarizations are applied to produce the selective heating mechanism.

Embodiment 1

Figure 4A:
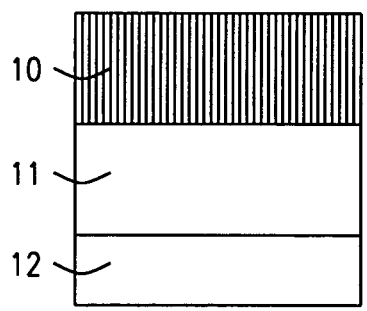
FIG. 4a and FIG. 4b are schematic side views of an exemplary MR sensor stack showing two possible arrangements of the plasmon generating layer and the MR stack.

Referring to FIG. 4a there is shown schematically a simplified patterned MR structure having an AFM layer (11) and other layer structures (12) exemplary of a patterned sensor stack film, which may contain magnetic and non-magnetic layers. This MR structure (as all MR structures referred to below) is produced by the patterning of an MR stack film formed on a wafer. An AFM pin anneal is achieved by heating the AFM layer, which hereinafter may be a layer of an alloy of Ir, Mn, Fe, Pt, Cr, Ni and their oxides, in the presence of an external magnetic field (not shown). A non-magnetic metallic plasmon generating layer (10), which can be Au, Ag or Cu, but is not limited to those materials, has a thickness between approximately 20 nm and 100 nm and is deposited in close proximity to AFM layer (11). The metallic plasmon generating layer can either be in direct contact with the AFM layer or it may be separated from the AFM layer by other layers that do not significantly affect the heat transfer between layers (10) and (11). There is no specific vertical arrangement of layers that is necessitated by the method (eg., see FIG. 4b). Layer (10) can be either the top (FIG. 4a) or bottom (FIG. 4b) layer as long as it is in close proximity to layer (11) and can effectively transfer heat to layer (11). When the layer (10) is formed with the MR film stack, the stack and layer (10) are patterned together so their shapes are similar. When the layer and the stack are patterned at different times, the layer can be formed with a different cross-sectional area than the stack or the layer can be formed in multiple disjoint portions on a single patterned stack portion. When the size, thickness, shape, orientation and material of layer (10) is properly matched to the wavelength, polarization and optical mode (if from an optical waveguide) of the incident light, a plasmon can be excited in layer (10) and generate the heating of layer (11) that is in close proximity. Multiple direction AFM pin anneals can be accomplished by any of the following schemes.

1. Referring to FIG. 5a, there is shown a schematic illustration showing a side view of two exemplary MR sensors, one (100) with a plasmon generating layer (10) and one (200) without a plasmon generating layer. Each sensor is shown (FIG. 5b) as having a circular cross-sectional area (100), (200) of the same approximate size. Referring to FIG. 5c, there is shown schematically that the two sensors coexist on the same wafer (1000). In a first step the entire wafer is AFM pin annealed with an increase in ambient temperature to a temperature above the Curie temperature of the AFM layer by an appropriate thermal process (not necessarily radiative) and with a first magnetic field, $H_1$, applied in a first direction (300). After this process, the wafer is cooled below the Curie temperature and both MR sensors have the pinning direction (400) of their AFM layers in the same direction. In a second step, illustrated schematically in FIG. 5d, a second magnetic field, $H_2$ (350) is applied in a second direction, while incident light (500) illuminates the two MR sensors, but only sensor (100), with layer (10) absorbs the incident light, generates a plasmon (600) and dissipates its energy into the AFM layer (11). The AFM layer is heated to above its Curie temperature and its magnetization is set along $H_2$. The dual pin is now complete.

2. Referring to FIG. 6a, there is shown a schematic illustration showing two exemplary MR sensors (110) and (210). As shown in FIG. 6b, each of the sensors is of a different size in terms of its circular horizontal cross-sectional area. Each sensor has a plasmon generating layer (10).

Referring to FIG. 6c there is shown schematically that the two sensors coexist on the same wafer (1000). In a first process step the entire wafer is AFM pin annealed with an increase in ambient temperature resulting from a thermal process that is not necessarily radiative, and with a first magnetic field, $H_1$, applied in a first direction (300). After this process, the wafer is cooled and both MR sensors have the pinning direction (400) of their AFM layers in the same direction. In a second step, illustrated schematically in FIG. 6d, a second magnetic field, $H_2$ (350) is applied in a second direction, while incident light (500) of a specific wavelength illuminates the two MR sensors, but only sensor (110), with the proper size for the incident wavelength, absorbs the incident light, generates a plasmon in its plasmon generating layer (10) and dissipates its energy into the AFM layer (11). The AFM layer is heated to above its Curie temperature and its magnetization is set along $H_2$ (450). The dual pin is now complete.

Figure 7A:
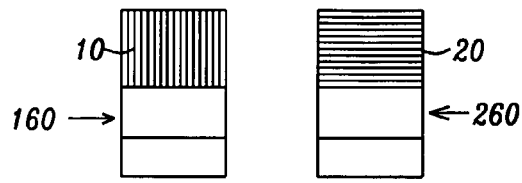
FIG. 7a through FIG. 7d are schematic illustrations of the heat treatment of the present invention as applied to sensors that are patterned so that plasmon generating layers of the same horizontal circular shape and dimension are formed with different materials.
Figure 7B:
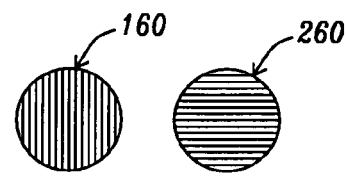
Figure 7C:
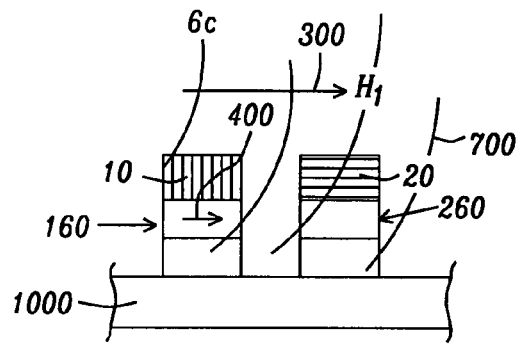
Figure 7D:
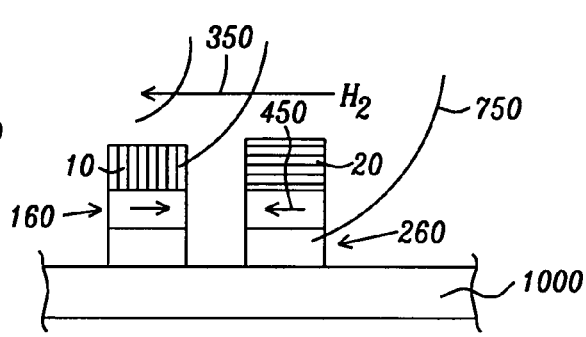

3. Referring to FIG. 7a, there is shown a schematic illustration showing two exemplary MR sensors (160) and (260). As shown schematically in FIG. 7b, each of the sensors is of the same size in terms of its horizontal cross-sectional area. Each sensor has a plasmon generating layer (10), (20) formed of different material, (eg. Au and Cu). Referring to FIG. 7c, it is seen that the two sensors coexist on the same wafer (1000). In a first step, light of a first frequency (700) that is optically attuned to the material of (10) is incident on the two sensors while a first magnetic field, $H_1$, applied in a first direction (300) is applied. Only the AFM of sensor (160) with its plasmon generating layer (10) of proper absorbing material is heated by the plasmon that is generated in (10). This process allows the first magnetic field to set the pin field (400) of the AFM of (160). In a second step, illustrated schematically in FIG. 7d, a second magnetic field, $H_2$ (350) is applied in a second direction, while incident light (750) of a specific wavelength optically attuned to the material of (20) illuminates the two MR sensors. But now, only sensor (260), with the proper material in its plasmon generating layer (20) for optimum absorption of the incident wavelength (750), absorbs the incident light, generates a plasmon and dissipates its energy into the AFM layer. The AFM layer is heated to above its Curie temperature and its magnetization (450) is set along $H_2$. The dual pin is now complete.

Figure 8A:
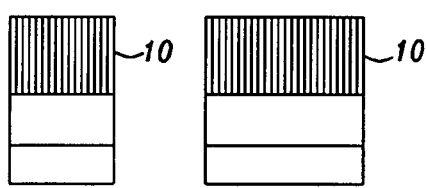
FIG. 8a through FIG. 8d are schematic illustrations of the heat treatment of the present invention as applied to sensors that are patterned so that plasmon generating layers of elliptical cross-section (high aspect ratio) and the same material are formed on along different directions.
Figure 8B:
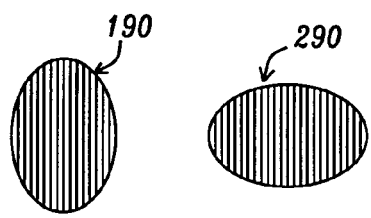
Figure 8C:
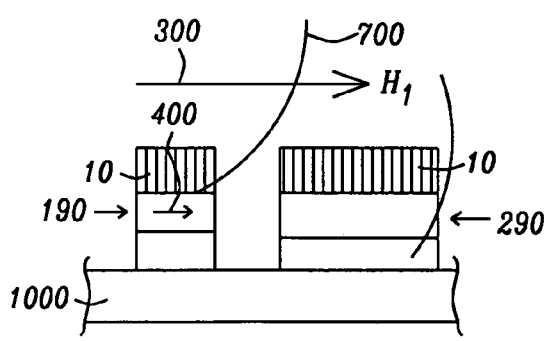
Figure 8D:
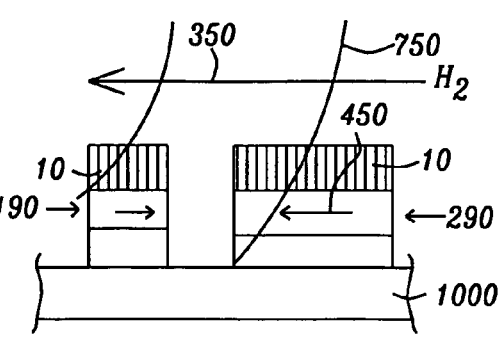

4. Referring to FIG. 8a, there is shown a schematic illustration showing two exemplary MR sensors (190) and (290). Each of the sensors is of the same size in terms of its horizontal cross-sectional area. Each sensor has been patterned with a horizontal cross-section that is elliptical with an aspect ratio greater than one. Each sensor is aligned horizontally so that its major axis is perpendicular to the other's. Each sensor has a plasmon generating layer (10), formed of the same material and having the same dimensions. Only their relative orientations differ. The two sensors coexist on the same wafer (1000). In FIG. 8c there is shown a first step, in which light of a first frequency and first polarization (700) that is optically attuned to the size and orientation of plasmon generating layer (21) is incident on the two sensors while a first magnetic field, $H_1$, applied in a first direction (300) is applied. Only the AFM of sensor (190) with its plasmon generating layer (10) of proper size and orientation to match the polarization of (700) is heated by the plasmon that is generated in (21). This process allows the first magnetic field to set the pin field (400) of the AFM of (190). In a second step, illustrated schematically in FIG. 8d, a second magnetic field, $H_2$ (350) is applied in a second direction, while incident light (760) of a specific wavelength and polarization optically attuned to the alignment of stack (290) illuminates the two MR sensors. But now, only sensor (290), with the proper alignment of its plasmon generating layer (10) for optimum absorption of the incident wavelength (750), absorbs the incident light, generates a plasmon and dissipates its energy into the AFM layer of (290). The AFM layer of (290) is heated to above its Curie temperature and its magnetization (450) is set along $H_2$. The dual pin is now complete.

It is noted that the above processes can be carried out using a multiplicity of incident radiation beams differing in wavelength and polarization and a corresponding multiplicity of GMR or TMR sensor structures provided with their own plasmon generating layers that are attuned to the wavelength and polarization characteristics of the radiation so as to absorb energy, form plasmons and transfer the plasmon energy to the underlying sensor structure only when they are irradiated with the proper radiation. The pinning process can also include a general heating that is of non-irradiative origin (eg. an oven) in which case all sensors will be pin annealed if the proper magnetic field is applied and the system is then cooled. In that case, subsequent plasmon heating will be applied only to sensor structures that are in contact with the proper plasmon generating layers. The initial pin direction will be eliminated and a new magnetic field direction will be established.

Embodiment 2

Figure 4B:
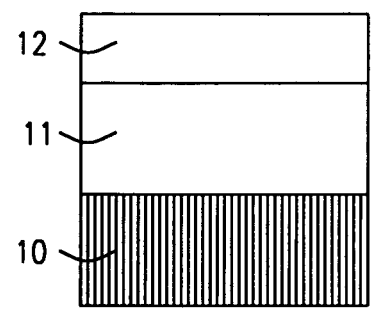

Every aspect of this embodiment is the same as that of Embodiment 1 as illustrated, for example, in FIGS. 4a and 4b, except that the plasmon generating layer (10) is not patterned together with the layers (11) and (12) constituting the sensor stack film, so that the plasmon generating layer has a larger and possibly differently shaped horizontal cross-sectional area than the patterned sensor layer stack film. Sensor stack film deposition and patterning and plasmon generating layer deposition and patterning can be achieved in different steps. Thus the patterned sensor stack film can be formed as a plurality of identical structures with identical horizontal cross-sectional shapes (the identical shapes in the following figures being shown as elliptical, but they could be circular, square, rectangular, or the like), while the shape, orientation, material composition and sizes of the differently patterned plasmon generating layers (10) contacting them can be different, to provide the necessary individual thermal effects to differentiate the pin directions. In the following figures (FIGS. 9a and 9b to FIGS. 12a and 12b) we shall show side and overhead views of identically patterned film stacks covered with different plasmon generating layers. The actual processing of these configurations with incident radiation and magnetic pinning fields will be described with reference to FIGS. 9c and 9d through FIGS. 12c and 12d.

Figure 9A:
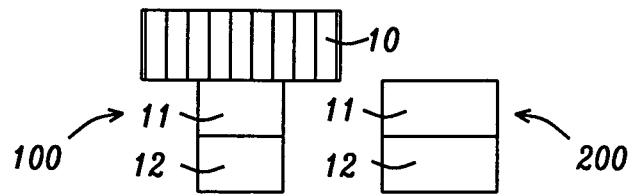
FIG. 9a through FIG. 9d are schematic illustrations of the heat treatment of the present invention as applied to identically patterned elliptical sensors on which either rectangular plasmon generating layers of larger dimension are formed or on which there are no plasmon generating layers formed.

1. Referring to FIG. 9a, there is shown a schematic illustration showing a side view of two exemplary patterned sensor stacks, one (100) with a plasmon generating layer (10) and one (200) without a plasmon generating layer. Each sensor is shown as having an elliptical cross-sectional area (100), (200) of the same approximate size. However, the plasmon generating layer (10) on (100) has a larger horizontal area than that of the MR sensor layers (11), (12) on which it is formed.

Figure 9B:
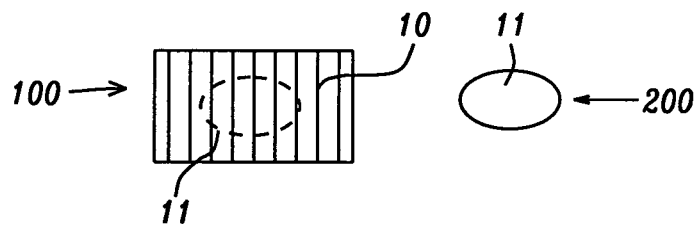
Figure 9C:
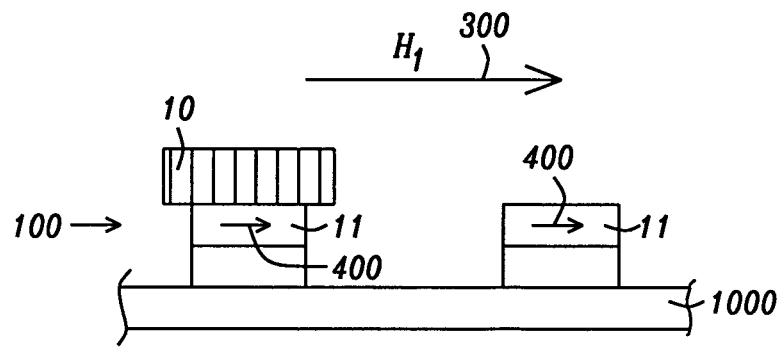

Referring next to schematic FIG. 9b, there is shown the horizontal cross-sectional shape as rectangular and extending beyond the periphery of the MR layers beneath it (which are shown in dashed outline).

In thermal and magnetic processing, the two sensor stacks would coexist on the same wafer (1000). In a first heating step, shown in FIG. 9c, the entire wafer is AFM pin annealed with an increase in ambient temperature by an appropriate thermal process (not necessarily a radiative process) and with a first magnetic field, $H_1$, applied in a first direction (300). After this process, the wafer is cooled and both sensor stacks have the pinning direction (400) of their AFM layers in the same direction.

Figure 9D:
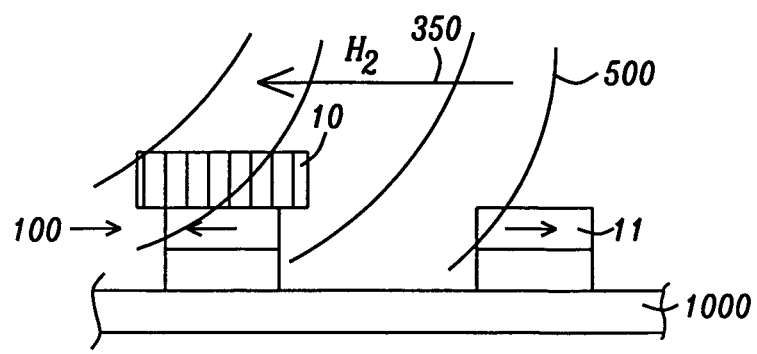

In a second step, illustrated schematically in FIG. 9d, a second magnetic field, $H_2$ (350) is applied in a second direction, while incident light (500) illuminates the two patterned MR sensor stacks, but only the stack (100), with layer (10) absorbs the incident light, generates a plasmon and dissipates its energy into the AFM layer (11). The AFM layer is heated to above its Curie temperature and its magnetization is set along $H_2$. The dual pin is now complete.

Figure 10A:
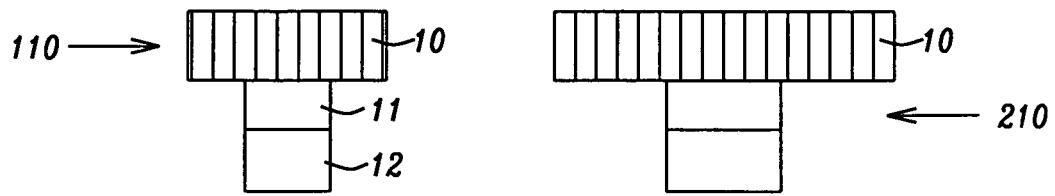
FIG. 10a through FIG. 10d are schematic illustrations of the heat treatment of the present invention as applied to identically patterned elliptical sensors on which elliptically patterned plasmon generating layers of different, but larger dimension are formed.

2. Referring to FIG. 10a, there is shown a schematic illustration showing two exemplary patterned MR sensors stack films (110) and (210) of identical elliptical cross-sectional area. Each sensor has a plasmon generating layer (10) of larger, different horizontal elliptical cross-sectional area formed on it.

Figure 10B:
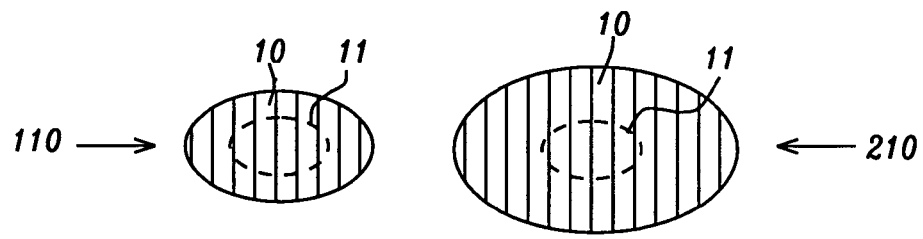

Referring to FIG. 10b, there is shown, schematically an overhead view of the MR sensors of FIG. 10a, showing (using a dashed outline) that each of the sensors is of a smaller size than the plasmon generating layer (10) formed on it, in terms of its elliptical horizontal cross-sectional area.

Figure 10C:
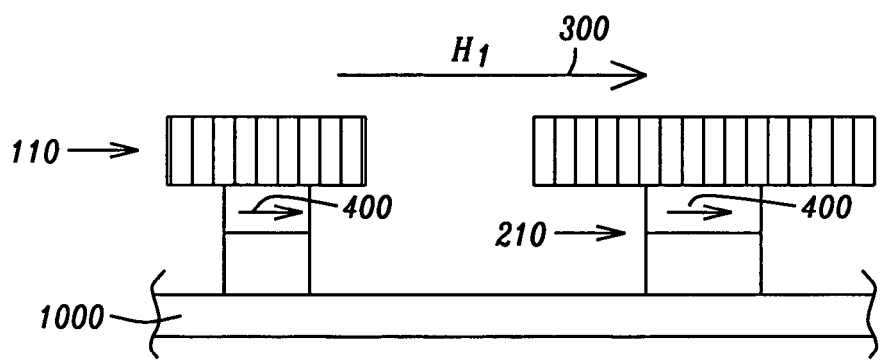

Referring to FIG. 10c there is shown schematically that the two sensors coexist on the same wafer (1000). In a first process step the entire wafer is AFM pin annealed with an increase in ambient temperature resulting from a thermal process that is not necessarily radiative, and with a first magnetic field, $H_1$, applied in a first direction (300). After this process, the wafer is cooled and both MR sensors have the pinning direction (400) of their AFM layers in the same direction.

Figure 10D:
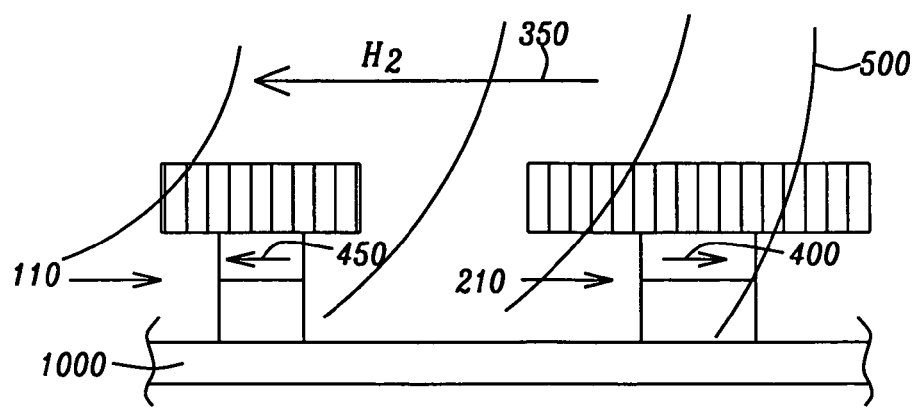

In a second step, illustrated schematically in FIG. 10d, a second magnetic field, $H_2$ (350) is applied in a second direction, while incident light (500) of a specific wavelength illuminates the two MR sensors, but only sensor (110), with the proper size (smaller, in this case) for the incident wavelength, absorbs the incident light, generates a plasmon in its plasmon generating layer (10) and dissipates its energy into the AFM layer (11). The AFM layer is heated to above its Curie temperature and its magnetization is set along $H_2$ (450). The dual pin is now complete.

Figure 11A:
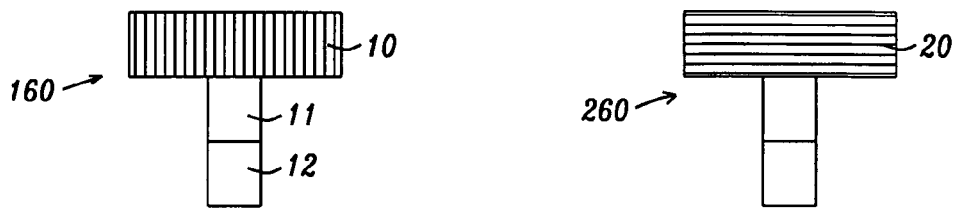
FIG. 11a through FIG. 11d are schematic illustrations of the heat treatment of the present invention as applied to elliptically patterned sensors on which larger elliptically patterned plasmon generating layers of different materials are formed.
Figure 11B:
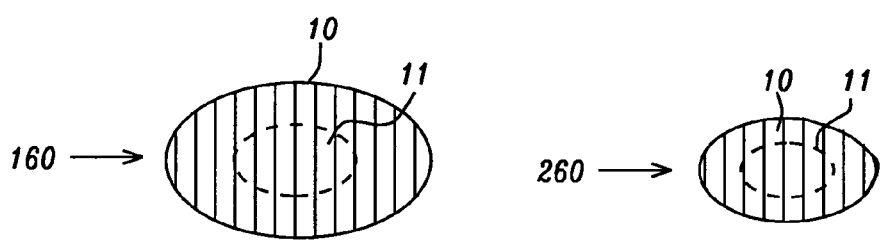

3. Referring to FIG. 11a, there is shown a schematic illustration showing two exemplary, identically patterned sensor stack films (160) and (260). As shown schematically in FIG. 11b, each of the patterned stacks is of the same size in terms of its horizontal elliptical cross-sectional area. Each patterned sensor stack has a plasmon generating layer (10), (20) formed of different material, (eg. Au and Cu) and each having an elliptical cross-sectional area of larger size than that of the sensor (which is shown in dashed outline).

Figure 11C:
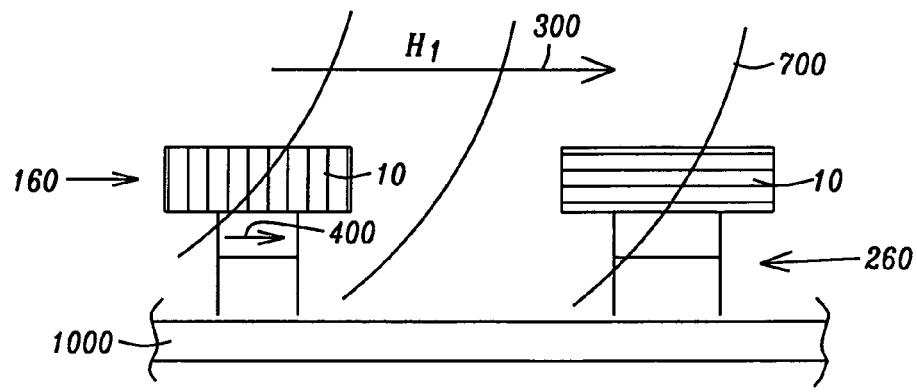
Figure 11D:
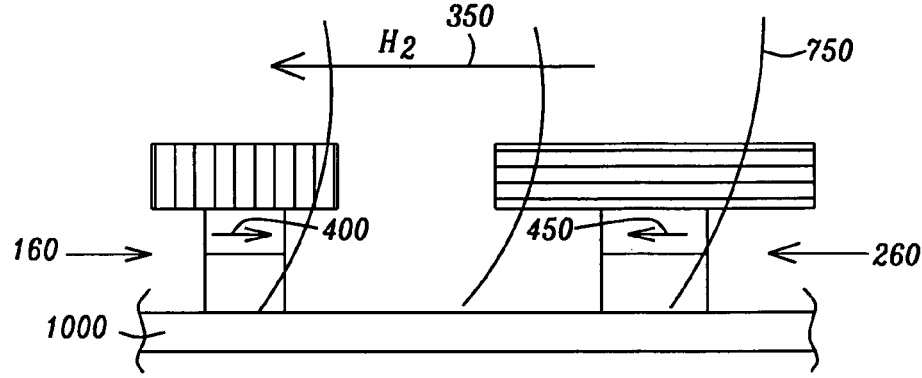

Referring to FIG. 11c, it is seen that the two stacks coexist on the same wafer (1000). In a first step, light of a first frequency (700) that is optically attuned to the material of (21) is incident on the two sensors while a first magnetic field, $H_1$, applied in a first direction (300) is applied. Only the AFM of sensor (160) with its plasmon generating layer (10) of proper absorbing material is heated by the plasmon that is generated in (10). This process allows the first magnetic field to set the pin field of the AFM of (160). In a second step, illustrated schematically in FIG. 11d, a second magnetic field, $H_2$ (350) is applied in a second direction, while incident light (750) of a specific wavelength optically attuned to the material of (20) illuminates the two MR sensors. But now, only sensor (260), with the proper material in its plasmon generating layer (20) for optimum absorption of the incident wavelength (750), absorbs the incident light, generates a plasmon and dissipates its energy into the AFM layer. The AFM layer is heated to above its Curie temperature and its magnetization is set along $H_2$. The dual pin is now complete.

4. Referring to FIG. 12a, there is shown a schematic illustration showing two exemplary identically patterned sensor stack films (190) and (290). Each of the sensors is of the same size in terms of its horizontal cross-sectional area. Each sensor has been patterned with a horizontal cross-section that is elliptical with an aspect ratio greater than one. Each sensor has a plasmon generating layer (10), formed of the same size, shape and material. These layers differ only in their relative orientation, which was produced by the patterning process. As shown in schematic FIG. 12b, the plasmon layers (10) are larger in horizontal cross-sectional area than the MR sensors on which they are formed and are aligned with their major axes perpendicular to each other.

In FIG. 12c there is shown that the two sensors coexist on the same wafer (1000). In a first step, light of a first frequency and first polarization (700) that is optically attuned to the size and orientation of plasmon generating layer (10) on sensor stack (190) is incident on the two sensors while a first magnetic field, $H_1$, applied in a first direction (300) is applied. Only the AFM of sensor (190) with its plasmon generating layer (10) of proper size and orientation to match the polarization of (700) is heated by the plasmon that is generated in (10). This process allows the first magnetic field to set the pin field (400) of the AFM of (190).

In a second step, illustrated schematically in FIG. 12d, a second magnetic field, $H_2$ (350) is applied in a second direction, while incident light (750) of a specific wavelength and polarization optically attuned to the alignment of stack (290) illuminates the two MR sensors. But now, only sensor (290), with the proper alignment of its plasmon generating layer (10) for optimum absorption of the incident wavelength (750), absorbs the incident light, generates a plasmon and dissipates its energy into the AFM layer of (290). The AFM layer of (290) is heated to above its Curie temperature and its magnetization (450) is set along $H_2$. The dual pin is now complete.

Embodiment 3

Figure 13A:
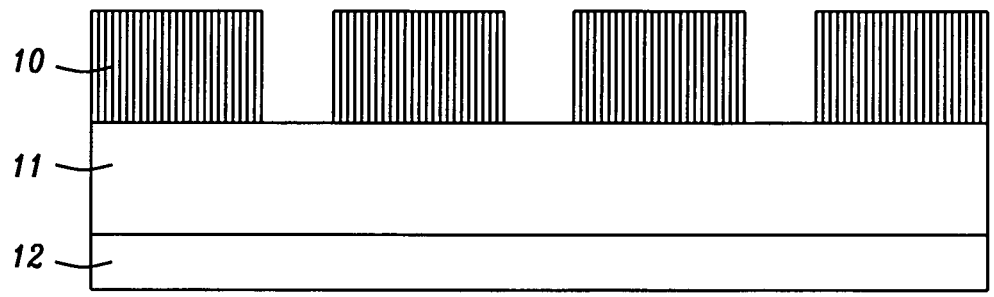
FIG. 13a and FIG. 13b are schematic side and overhead views of a large elliptically patterned sensor being covered by disjoint parallel rectangular strips of identical plasmon generating layers, oriented to advantageously couple to polarized radiation.

Referring to FIG. 13a, there is shown a side cross-sectional view of a third embodiment in which the MR sensor layers (11), (12) are deposited first and then at least two (four being shown here) disjoint pieces of a patterned plasmon generating layer (10) are formed over the sensor layers, where the disjoint pieces of the patterned plasmon generating layers will act together to provide the heating effect of the invention.

Figure 13B:
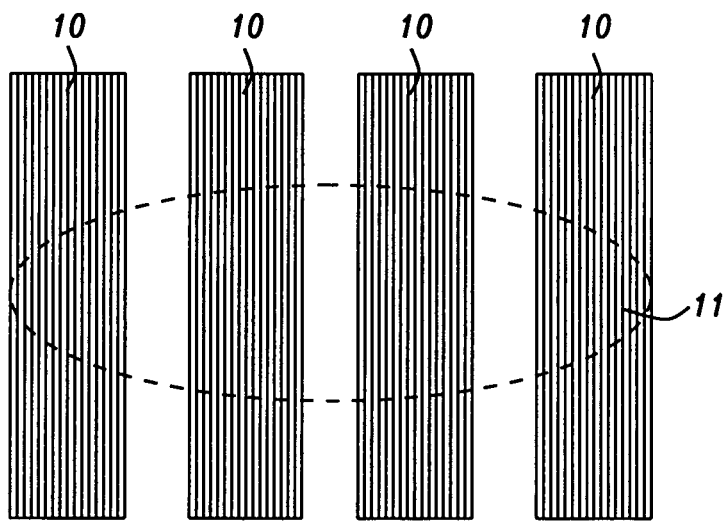

Referring next to FIG. 13b, there is shown an overhead view of the fabrication in FIG. 13a, indicating how the disjoint pieces of the plasmon generating layers (10) may be deposited as disjoint rectangular strips across an MR sensor structure that is patterned as a substantially elliptical sensor stack film, in this exemplary configuration, in its horizontal cross-sectional shape. In this configuration, light polarized along the maximum length direction of the patterned plasmon generating layer strips will effectively transfer energy to the strips and thereupon to the MR sensor.

Figure 13C:
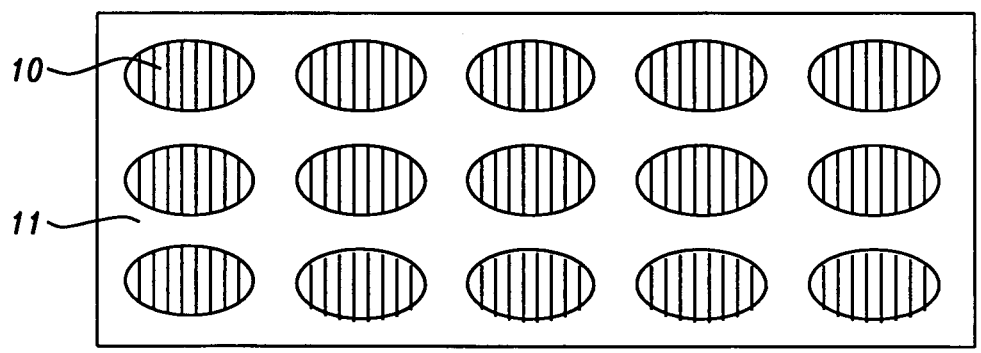
FIG. 13c shows a large sensor covered by a plurality of small plasmon generating layers.

Referring finally to FIG. 13c, there is shown yet another alternative approach to transferring energy to a large sensor structure (11), where a plurality of small, disjoint plasmon generating layers (10), shown here as elliptical in shape, but not limited by such a shape, are disposed over the surface of the sensor structure.

Embodiment 4

This embodiment is in all respects similar to Embodiment 1, except that instead of being limited to an MR sensor stack, as shown, for example in FIGS. 4a and 4b, the deposited films or the portions of the wafer level fabrication to which the plasmon generating layers (10) are attached include other patterned devices or structures that require selective heating or focused illumination to achieve some desired outcome.

Embodiment 5

This embodiment is in all other respects the same as in Embodiment 2, except that instead of an MR sensor stack, the films or wafer level fabrications to which the plasmon generating layers (10) are attached include other patterned devices or structures that require selective heating or focused illumination to achieve some desired outcome.

Embodiment 6

This embodiment is in all other respects the same as in Embodiment 3, except that instead of an MR sensor stack, the films or wafer level fabrications to which the plasmon generating layers (10) are attached include other patterned devices or structures that require selective heating or focused illumination to achieve some desired outcome.

Embodiment 7

Figure 14:
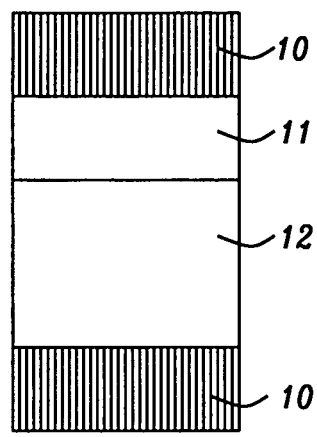
FIG. 14 is a schematic illustration of a side cross-sectional view of an exemplary sensor sandwiched between two identical plasmon generating layers.

Referring to FIG. 14, it is seen that this embodiment is in all other respects the same as in Embodiment 1, except that instead of a single plasmon generating layer (10) in close proximity to the AFM layer in the MR sensor stack, the entire MR sensor stack is sandwiched between two parallel plasmon generating layers (10) formed on its horizontal surfaces and displaced vertically from each other. The two plasmon generating layers are substantially identical in size, shape and material content so that, as a unit, they can enhance the heating effect on the MR sensor stack.

Embodiment 8

Referring again to FIG. 14, this embodiment is in all other respects the same as in Embodiment 2, except that instead of a single plasmon generating layer (10) in close proximity to the AFM layer in the MR sensor stack, the entire MR sensor stack is sandwiched on both of its horizontal surfaces by two parallel plasmon generating layers (10) displaced vertically from each other. The two plasmon generating layers are substantially identical in size, shape and material content to each other, but are patterned separately from the MR sensor stack to have a larger cross-sectional area. As a unit, the two plasmon generating layers can enhance the heating effect on the MR sensor stack.

Embodiment 9

Figure 15:
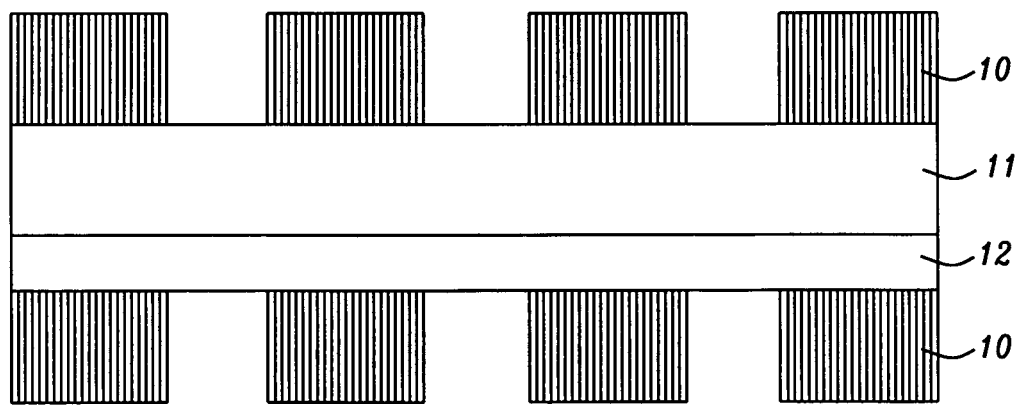
FIG. 15 is a schematic illustration of a side cross-sectional view of a large elliptically patterned sensor sandwiched between two identical arrays of plasmon generating layers, with each array being similar to that illustrated in FIGS. 13a and 13b.

Referring to schematic FIG. 15, it is shown that this embodiment is in all other respects the same as shown in FIG. 13 of Embodiment 3, except that instead of a plurality (4 being shown) of disjoint parallel pieces of a patterned plasmon generating layer (10) on one surface of the stack in close proximity to the AFM layer in the MR sensor stack, the MR sensor stack is sandwiched on both of its horizontal surfaces by two sets of identical disjoint parallel pieces of a patterned plasmon generating layer (10), vertically displaced from each other. The two patterned plasmon generating layers are substantially identical in size, shape and material content so that, as a unit, they can enhance to heating effect on the MR sensor stack.

As is finally understood by a person skilled in the art, the preferred embodiments of the present invention are illustrative of the present invention rather than limiting of the present invention. Revisions and modifications may be made to methods, materials, structures and dimensions employed in forming and providing a method of selectively heating a plurality of MR devices so that individual devices can be magnetically pinned in different directions, or of selectively heating a plurality of other, wafer level device fabrications so that individual devices can be treated thermally, each in a different manner, while still forming and providing such a method of formation and the devices so formed in accord with the spirit and scope of the present invention as defined by the appended claims.

What is claimed is:

1. A method to produce multiple AFM (anti-ferromagnetic) layer pinning directions in a patterned GMR (giant magneto-resistive) or TMR (tunneling magneto-restive) sensor structure including at least one AFM layer and formed on a wafer, comprising:

providing a wafer having a GMR or TMR sensor stack film formed thereon, wherein said sensor stack film includes at least one layer of anti-ferromagnetic material capable of pinning a direction of magnetization established in an adjacent layer of ferromagnetic material by means of a AFM coupling therebetween;

forming over or within said sensor stack film a layer of plasmon generating material;

patterning said sensor stack film and said layer of plasmon generating material to produce patterned portions thereof; then irradiating said plasmon generating material with a succession of freely propagating and unconfined beams of electromagnetic radiation, wherein each beam is characterized by properties including intensity, wavelength and polarization; whereby plasmon modes are generated in portions of said patterned plasmon generating material in accord with energy absorption efficiencies associated with the properties of said freely propagating and unconfined radiation and its relationship to the physical properties of said plasmon generating material, and said size and shape of said portions of said patterned plasmon generating layer and wherein corresponding patterned portions of said sensor stack film are heated by energy transferred from said patterned portions of said plasmon generating layer contacting said patterned portions of said sensor stack film and whereby said portions of said sensor stack film are heated above a Curie temperature; then establishing, during each of said succession of irradiations by said freely propagating and unconfined beams of irradiation and while said portions of said sensor stack film are thereby at a temperature above a Curie temperature, a desired pin direction along which said magnetization in said layer of ferromagnetic material is to be maintained by said at least one AFM layer in said heated patterned portions of said sensor stack film, wherein said pin direction is created by application, during each of the succession of beams of freely propagating and unconfined irradiation, of a magnetic field, H, having said desired pin direction whereby multiple pin directions are produced.

2. The method of claim 1 wherein before said irradiation said wafer is heated to a temperature above a Curie temperature by a general ambient thermal process, whereby all said patterned sensor stack portions have a pin direction set by application of a magnetic field, $H_1$, and thereafter, said wafer is cooled to a temperature below said blocking temperature.

3. The method of claim 1 wherein said patterned plasmon generating layer may be formed over said patterned sensor stack film or wherein said patterned plasmon generating layer may include a portion formed beneath said patterned sensor stack film or wherein said patterned sensor stack film may be sandwiched between a patterned plasmon generating layer formed beneath said patterned sensor stack film and over said patterned sensor stack film.

4. The method of claim 3 wherein said patterned plasmon generating layer may be patterned at the same time as said sensor stack film or may be patterned after a patterning of said sensor stack film.

5. The method of claim 1 wherein said AFM layer is any anti-ferromagnetic material layer that displays a weakening or a loss of an AFM phase with increased temperature.

6. The method of claim 5 wherein said anti-ferromagnetic material is an alloy of Ir, Mn, Fe, Pt, Cr, Ni or their oxides.

7. The method of claim 1 wherein said patterned plasmon generation layer forms a regular 1-dimensional or 2-dimensional array.

8. The method of claim 1 wherein said succession of beams of electromagnetic radiation are optionally produced by an incandescent source, a fluorescent source, a gas discharge source, a high intensity discharge source, a halogen source, an LED source or a laser source.

9. The method of claim 1 wherein said sensor stack film includes layers that have horizontal and vertical surfaces and said patterned plasmon generation layer contacts either said horizontal or said vertical surfaces.

10. The method of claim 1 wherein said patterned plasmon generating layer does not cover all patterned sensor portions, whereby said irradiation does not heat said uncovered patterned sensor portions.

11. The method of claim 1 wherein said sensor stack film and said plasmon generating layer are patterned to form a regular 1-dimensional array or 2-dimensional matrix.

* * * * *